(12) United States Patent
Curt et al.

(10) Patent No.: US 7,701,356 B2
(45) Date of Patent: Apr. 20, 2010

(54) UNDERGROUND MONITORING SYSTEM AND METHOD

(75) Inventors: Walter Curt, Harrisonburg, VA (US);
Glen K. Shomo, Harrisonburg, VA (US);
Christopher Mullins, Penn Laird, VA (US)

(73) Assignee: Power Monitors, Inc., Mount Crawford, VA (US)

( * ) Notice: Subject to any disclaimer, the term of this patent is extended or adjusted under 35 U.S.C. 154(b) by 339 days.

(21) Appl. No.: 11/687,453

(22) Filed: Mar. 16, 2007

(65) Prior Publication Data

US 2007/0229295 A1    Oct. 4, 2007

Related U.S. Application Data

(60) Provisional application No. 60/783,318, filed on Mar. 16, 2006.

(51) Int. Cl.
*G08B 21/00* (2006.01)
(52) U.S. Cl. .................. 340/635; 340/662; 324/522

(58) Field of Classification Search ............... 340/635, 340/662; 324/522, 543, 548, 555; 700/22, 700/286
See application file for complete search history.

(56) References Cited

U.S. PATENT DOCUMENTS

| | | | | |
|---|---|---|---|---|
| 5,565,783 | A | * | 10/1996 | Lau et al. .................... 324/522 |
| 5,796,631 | A | | 8/1998 | Iancu et al. |
| 6,091,337 | A | * | 7/2000 | Arshad et al. .............. 340/662 |
| 6,169,406 | B1 | | 1/2001 | Peschel |
| 6,633,163 | B2 | * | 10/2003 | Fling ......................... 324/326 |
| 2003/0224784 | A1 | | 12/2003 | Hunt et al. |
| 2005/0273183 | A1 | | 12/2005 | Curt et al. |
| 2008/0159244 | A1 | * | 7/2008 | Hunziker .................... 370/338 |

OTHER PUBLICATIONS

Written Opinion of the International Searching Authority.

* cited by examiner

*Primary Examiner*—John A Tweel, Jr.
(74) *Attorney, Agent, or Firm*—K&L Gates LLP

(57) ABSTRACT

An underground monitoring system includes one or more sensors configured to monitor an underground electrical system, a processor configured to monitor the one or more sensors and an alarm device configured to send an alarm when a condition is detected by the processor.

22 Claims, 2 Drawing Sheets

UNDERGROUND MONITORING SYSTEM AND METHOD

CROSS REFERENCE TO RELATED APPLICATIONS

This patent application claims the benefit of U.S. Provisional Application No. 60/783,318, filed on Mar. 16, 2006, entitled "UNDERGROUND MONITORING SYSTEM AND METHOD", which is incorporated herein by reference in its entirety.

BACKGROUND

High-density urban areas often use an underground network grid to distribute electrical power. In this situation, a grid of transformers convert high-voltage (13 kV or greater) feeds from substations into low voltage (under 600V, typically 120V) secondaries. These secondary conductors are connected in parallel, providing a redundant link. The secondary conductors are often 500 MCM copper, with rubber/neoprene insulation. A typical vault or service box would contain a three phase service, and each phase would consist of two parallel 500 MCM conductors from a network transformer. Usually there are two or more sets of these, also connected in parallel. Thus, there may be 6, 12, or 18 500 MCM copper wires, with 2, 4, or 6 wires for each phase. The neutral is also paralleled, but sometimes with not as many conductors.

Although the network grid system is very reliable, periodic maintenance is required, and equipment breakdowns do occur. It is costly and time-consuming to enter an underground vault, due to safety issues as well as logistical issues (e.g. blocking traffic, unwelding manhole covers, etc.) Consequently, the electrical utility often cannot economically monitor the state of the network system.

One failure type is a cable fault. When a cable fault occurs, extremely high currents flow, and this often causes severe damage to the cable, and even to nearby cables. To prevent this, cable limiters are used. These are fast-acting fuses that are designed to open before the cable insulation itself is damaged. They are not designed for overload protection, just fault current protection. These are typically placed in series with each conductor, at every junction and access point in the secondary grid. Doing that minimizes the repair work needed after a fault, and limits the damage to the single faulty cable.

The redundant nature of the grid insures that if a single cable fails, the limiter removes it from the circuit, and the rest of the cables absorb the load. Gradually the capacity of the secondary network is degraded as more faults occur over time. Since the network continues to function, and underground cable inspection is very costly, the utility has no easy way to determine how quickly this is happening, or where the faulty cables are in the network.

SUMMARY

An underground monitoring system includes one or more sensors configured to monitor an underground electrical system, a processor configured to monitor the one or more sensors and an alarm device configured to send an alarm when a condition is detected by the processor. The processor can be configured to log conditions detected by one or more sensor for later transmission to a user. The transmission can be periodic or occasional and can be initiated by the processor or by the user. Further, the user can be local or remote.

Additional features and advantages are described herein, and will be apparent from, the following Detailed Description and the figures.

DETAILED DESCRIPTION

In one embodiment, an underground monitoring system is provided. The underground monitoring system preferably provides the electrical utility with a convenient method to measure and record many different aspects of the underground secondary distribution system; however, the underground monitoring system can provide any suitable features to any suitable entity. In one embodiment, the system is used to find open limiters and/or faulty cables in underground networks. In another embodiment, the system monitors other parameters of the distribution system, such as voltage power quality, hazardous contact voltage, directional power flow, system impedance, and/or any other suitable parameters or values. In another embodiment, other equipment is monitored, such as transformers, network protectors, steam and gas equipment, cathodic protection systems, and/or environmental parameters such as temperature, humidity, oil and water level, and/or any other suitable equipment or environmental parameters.

Figure 1:
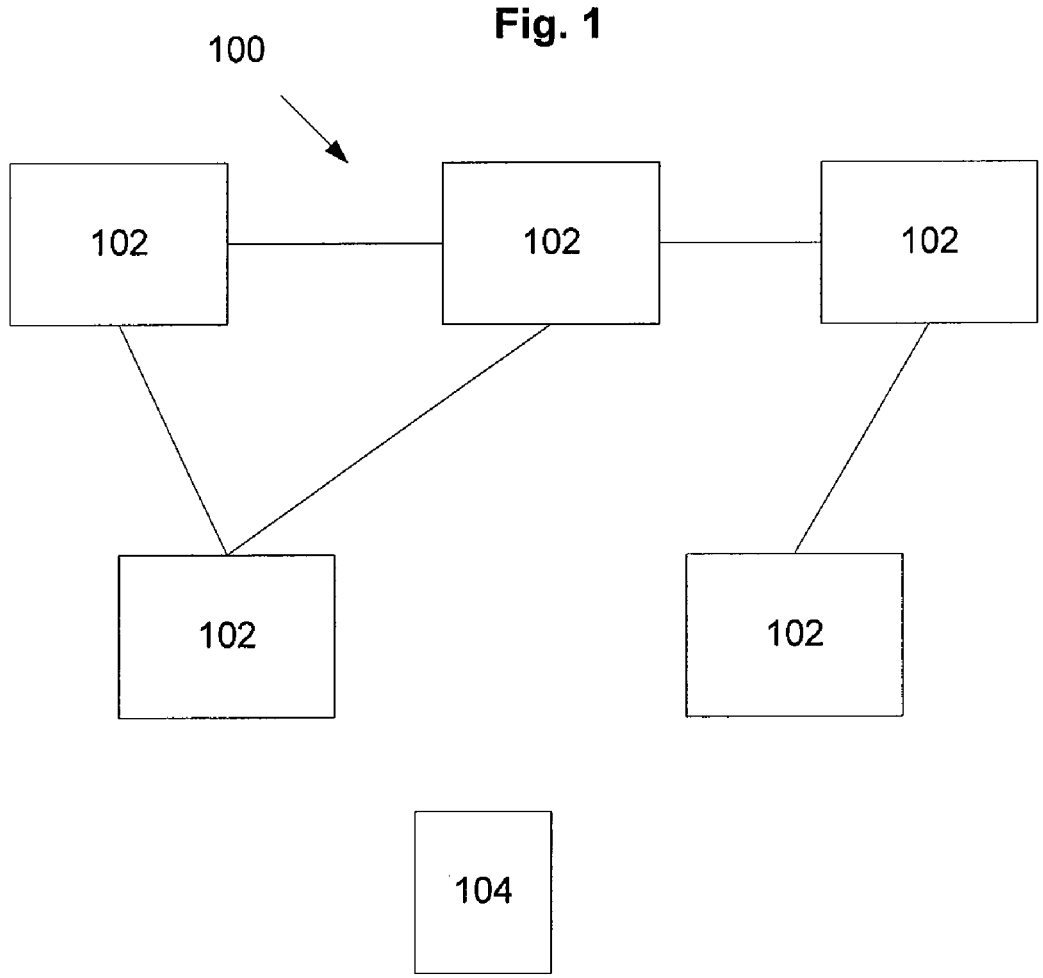
FIG. 1 is block diagram of an underground monitoring system in accordance with one embodiment.
Figure 2:
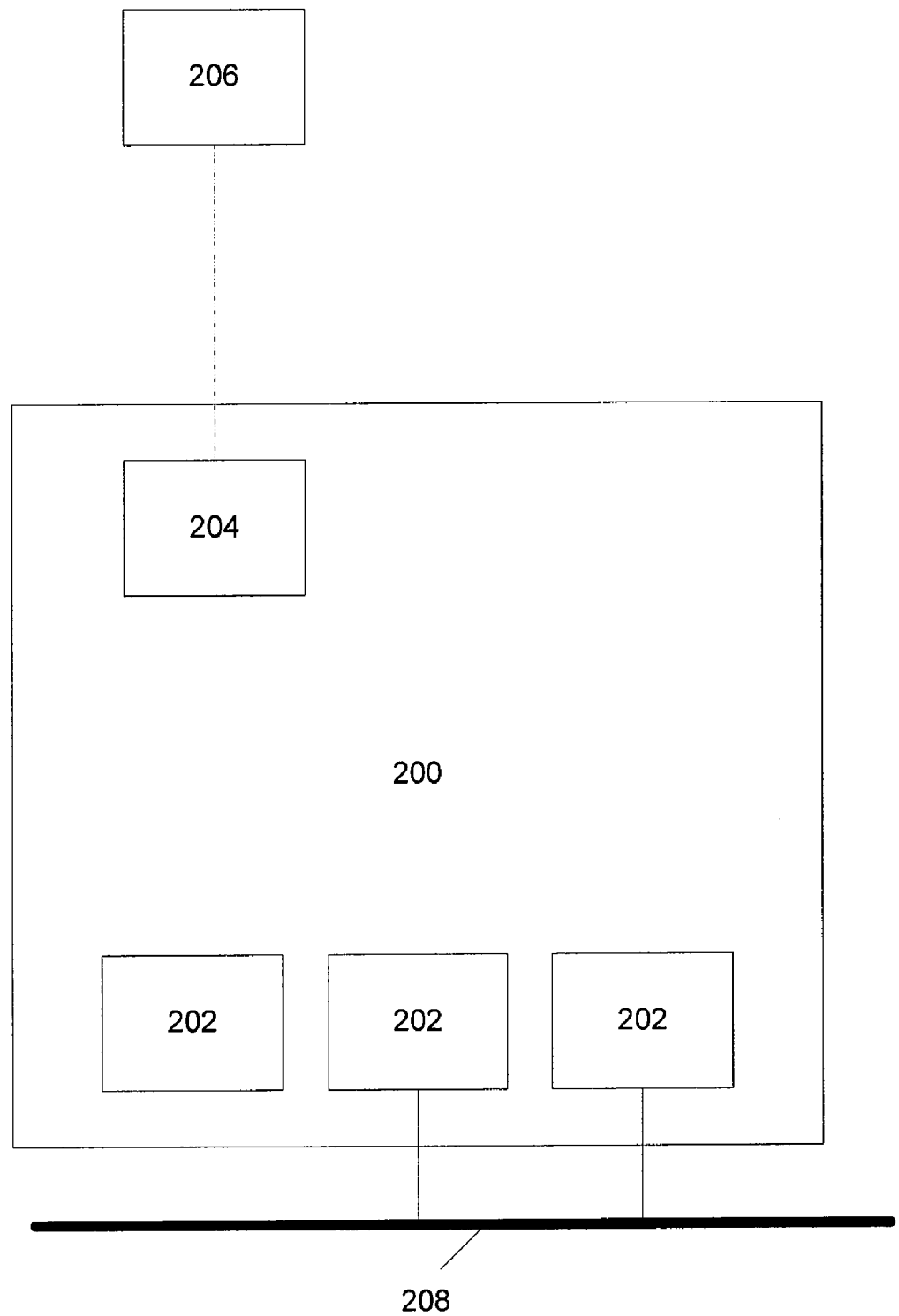
FIG. 2 is block diagram of a monitoring device in accordance with one embodiment.

One embodiment is illustrated in FIGS. 1-2. The monitoring system 100 includes one or more monitoring devices 102. The monitoring devices 102 are able to communicate information about the conditions they monitor to a reader 104 (e.g., a PC or PDA). As shown in FIG. 2, a monitoring device 200 can include one or more sensors 202. The sensors 202 can monitor conditions of the power line system 208, environmental conditions or any other suitable conditions. The monitoring device 200 can also include a transmitter 204 that transmits information to another device 206. The transmission can be wired or wireless and the other device 206 can be a relay, a bridge, another monitoring device 200, a PDA or any other suitable device. Further, the monitoring device can be located underground or in any other suitable location. Similarly, the other device 206 can be located above ground or in any other suitable location.

In one embodiment, the underground monitoring system includes a microprocessor for controlling all other parts of the system; however, the microprocessor is not required or can have any suitable controlling capabilities and/or duties. The system also preferably includes a power supply (e.g., line voltage, current or battery powered or any other suitable power supply). The system can also include current and voltage transducers; however, such transducers are not required. The system can also include a VLF beacon system for underground conductor status and other alarm status; however, the system is not required to include such a beacon system, the system can include a different type of beacon system and/or the system can include a beacon system having any suitable functionality. Optionally, the system can include a VLF transceiver for VLF network message passing or any other suitable purpose; however such a transceiver is not required and any suitable type of transceiver can be included.

In one embodiment, the system includes a contact-voltage monitor, a secondary conductor monitor and/or a power quality monitor; however, such monitors are not required. In one embodiment, the system include a voltage phase angle transducer for power flow monitoring or any other suitable purpose; however, such a transducer is not required.

In one embodiment, the system includes a high-speed RF link for data download or any other suitable purpose; however, such a link is not required and any other suitable link can be included. In various embodiments, the system includes an interface to any other suitable digital equipment (e.g., a network protector relay or any other suitable interface or equipment); however, such an interface is not required. Further, in various embodiments, the system includes any other suitable sensor or monitoring such as cathodic protection monitoring, temperature sensors, humidity sensors, water level sensors, transformer monitoring, power flow sensors, NP relays monitoring and/or any other suitable sensor or monitoring; however, such sensors or monitoring is not required.

In one embodiment, the system includes a VLF-WAN bridge; however, the system can include any other suitable bridge and is not required to have such a bridge. In another embodiment, the system includes a high-speed RF-WAN bridge; however, the system can include any other suitable bridge and is not required to have such a bridge.

Preferably, the system includes software (e.g., PC software or any other suitable software) for data management and analysis or any other suitable purpose; however, such software is not required. In one embodiment, the system includes software (e.g., PDA software or any other suitable software) for field use (with VLF radio and/or a high-speed RF transceiver or any other suitable transmission mechanism) or any other suitable purpose; however, such software is not required. In yet another embodiment, the system includes a power line communication (PLC) transceiver; however, such a transceiver is not required.

In various embodiments, the utility is enabled to choose the amount of monitoring present in one or more locations by including, excluding or including but not using one or more of the above mentioned devices, features and/or functions of the system. For example, it may be desirable to have many of the above described devices, features and/or functions when applying an embodiment to one or more vaults with network protectors, transformers, and other equipment, while it may be desirable due to cost or other considerations to have fewer devices, features and/or functions (e.g., a microprocessor, power supply, current and/or voltage transducer, beacon system and secondary conductor monitor or any other suitable set of devices, features and/or functions) when applying an embodiment to one or more underground junction boxes with just secondary conductors and current limiters. However, any suitable combination of the above or other components can be included in an underground monitoring system in any suitable application of an embodiment. Preferably components can be added to an underground monitoring system after it is designed and/or configured. However, an underground monitoring system can be complete and/or disallow additions upon creation. The VLF-WAN bridge, high-speed RF-WAN bridge and various software components are preferably not installed underground. However, any component can be installed in any suitable location. For example, either bridge can be installed underground if a WAN connection is available underground or any other condition makes such an installation desirable.

Preferably, the microprocessor supervises all installed components. However, the microprocessor can supervise less than all installed components. Preferably, each installed component performs its own monitoring and recording function, which can be implemented with the microprocessor or can be implemented with the component's own separate microprocessor. However, one or more installed components can be monitored and recorded in any suitable manner by any suitable device. If a function uses a separate microprocessor, inter-processor communication will preferably be with RS-232, USB or some other local protocol; however, any suitable communications protocol can be used. In one embodiment, the microprocessor can be an XScale or ARM processor running Windows CE, acting as a hub for the other components; however, any suitable microprocessor or electronic circuit can be used. In another embodiment, the microprocessor is the same processor as that used in the power quality monitor; however, the power quality monitor is not required to use the same processor. In still another embodiment, a DSP can function as the processor; however a DSP is not required and/or can function in any other suitable manner.

Preferably, the microprocessor monitors all installed components, and performs any necessary logging (if not logged by the components themselves). However, the microprocessor can monitor and log any subset of the installed components in addition to or instead of the component logging and monitoring itself. The microprocessor preferably sends alarm alerts using a VLF beacon if installed; however alarms can be sent in any suitable manner. If a VLF communication system is installed, the microprocessor can send an alert message through that in addition to, or in lieu of a beacon alert or in any other suitable manner. In one embodiment, the microprocessor can also monitor and log information from other equipment with a digital interface with its own digital interface or in any other suitable manner. One example would be a connection to a network protector relay. In one embodiment, the microprocessor can log relay operations, phase difference voltages or any other suitable loggable information, and also can act as a bridge between the relay and other communications links using a VFL-WAN or RF-WAN bridge or in any other suitable manner. In another embodiment, the microprocessor can measure and/or log any suitable analog sensors and transducers using any other suitable sensors or in any other suitable manner.

In one embodiment, utility personnel preferably periodically patrol a portion of or the entire network grid on foot or in vehicles or in any other suitable manner, using PC software or PDA software and a suitable receiver or using any other suitable device and/or software. Any beacon alerts can preferably be investigated by utility workers. In one embodiment, the utility worker may connect to the device using a high-speed RF link (e.g. Bluetooth or WiFi), if installed, or in any other suitable manner. With this high-speed connection, the user can download recorded data without entering the vault. Due to RF propagation limits at high data rates or any other suitable constraints, the user preferably has close to line-of-sight to the antenna, which will typically be located directly underneath a manhole or grating. However, the user can achieve high data rates or slow data rates in any suitable manner.

In one embodiment in which a VLF-WAN bridge is available and a VLF beacon is installed, alert beacons can be received at the utility office without being near the underground location. Beacon messages received by the bridge are relayed through the WAN back to the utility or in any other suitable manner.

In another embodiment in which a VLF-WAN bridge is available and a VLF transceiver is installed, two-way communications are possible between the utility office and the underground location. In this configuration the bridge preferably passes bidirectional traffic between the utility PC network and the underground VLF network (whose endpoints are a microprocessor).

In one embodiment, the WAN network is an Ethernet or WiFi network, a low-speed powerline carrier system such as the Hazeltine system or any other suitable network.

In another embodiment, in which a high-speed RF link is installed and a high-speed RF-WAN bridge is installed, high-speed data may be exchanged between microprocessor and the utility WAN. In one embodiment, a Bluetooth transceiver and a Bluetooth-Ethernet bridge are used. In this embodiment, the Bluetooth transceiver is preferably located underground (directly or indirectly connected to the microprocessor), while the bridge is preferably above ground, connected to a WAN. However, the transceiver and bridge can be arranged in any suitable manner. The antenna for the transceiver is preferably underneath a manhole cover or metal grating, with some line-of-site exposure to the antenna for the bridge, which may be mounted on a building or telephone pole. Alternatively, the components above can be arranged and positioned in any suitable manner.

In various embodiments, the WAN link is a cellular modem connection, a digital cell connection (e.g. CDMA, EVDO, etc.), a satellite RF link or any other suitable link or connection.

In one embodiment, data collected from the microprocessor is analyzed and stored using PC software or any other suitable software. In another embodiment, PDA software or any other suitable software can also display real-time data, and download data through a high-speed link, if present, or receive low-speed data and alerts through a beacons system and/or a transceiver, if present.

In various embodiments, a microprocessor is preferably the central control for all other components; however, any different suitable control topography may be utilized. The microprocessor (or processor) can be a low-power microprocessor or DSP, an embedded Linux or Windows CE system or any other suitable system or processing device. The processor can be shared with another component or component's processor (e.g., the power quality monitor or any other suitable device).

Preferably, the microprocessor monitors all other components, and optionally logs data from the other components; however, the microprocessor can monitor any suitable subset of components and is not required to log data. In one embodiment, the processor manages and routes all communications between other components and external links; however such managing and routing is not required.

In one embodiment, the microprocessor has a real-time clock for data timestamping. In another embodiment, the processor receives timing information from an external source via any suitable communications mechanism.

In various embodiments, several power supply options are implemented. A line-voltage power supply is the preferred power supply and is designed for a 60-600 VAC input range, similar to that of the power quality monitor; however, the power supply can be any suitable power supply and can have any suitable design and/or input range.

In another embodiment, the system includes a long-life lithium battery, either primary or rechargeable or any other suitable power source. The battery preferably provides power during an outage (if the line-voltage power supply or other power supply is also present); however, the battery can supply power at any suitable time. If the battery is the only source of power, then the entire device is preferably operated in a low-power mode, sampling only periodically to conserve battery power; however, the device can be operated in any suitable manner. When an alarm condition appears, the beacon transmitter is used to periodically send an alert, preferably in a power-saving pattern; however, the beacon can operate in any suitable manner in various embodiments. If the unit is using battery power, beacon transmissions are preferably kept substantially to a minimum, to conserve battery power. The beacon transmit time and repetition rate are preferably reduced. A battery life of several years is preferable; however, the battery can have any suitable expected or actual life. The device of this embodiment preferably draws very little power until a conductor becomes open (e.g., as determined by a secondary conductor monitor) or any other suitable alarm condition declared. Then, the beacon consumes relatively large amounts of power. The microprocessor is preferably programmed or configured so that the beacon can transmit periodically for long enough for the utility to detect the beacon. For example, if the utility surveys the network grid for beacons once per month, the battery preferably powers the beacon transmitter for at least one month to insure the utility will detect it before the battery dies. Once the utility detects the beacon, the open conductors are replaced, or other alarm condition examined, and the device battery may be replaced or recharged. If the battery is sealed in the unit, the entire assembly may be replaced. It should be noted, the battery can have longer life than the expected or actual interval between attempts at detection of a beacon by the utility to provide greater certainty that an unexpectedly short-lived battery or an unexpectedly long gap between checks for beacons does not cause a beacon to be missed.

In various embodiments, in addition to, or in lieu of a line-voltage supply, a power supply which draws power from the secondary conductors' external magnetic field can be used. Since the average power to operate the device is preferably very low (typically under one watt—however, the device can require any suitable amount of power), enough power can be tapped from the external magnetic field with a pickup coil to provide device power. The pickup coil may be integrated into the current transducers, in which case an iron-core transducer may be used in place of Rogowski coils; however, such an induction-based or other electromagnetic force utilizing power source can be implemented in any suitable manner.

Alternatively, the unit can be powered from an external AC or DC source, if available in the manhole or from any other suitable location. In various embodiments, one or more power supply components for the entire device may be shared with the supply from an optional component (e.g., power quality monitor can include a line-voltage power supply capable of powering the entire device).

Various embodiments have various power supply configurations, and in various embodiments, various features and/or components are only available when certain power modes are present. For example, the RF link may only operate in one embodiment when operating from line-voltage power. The beacon transmitter may operate differently (e.g. different power levels, modulation techniques, etc.) depending on the available power sources in another embodiment.

In one embodiment, the power supply may include provisions for storing energy. For example, if the power source is AC conductor current, the power supply may not be able to power the VLF beacon transmitter continuously. In this case, it may store energy in a capacitor or battery. Then, when enough energy is present, the microprocessor can send a burst transmission. The power supply then recharges the energy storage device.

In one embodiment, the system uses low-cost Rogowski-coil transducers. Such devices can be easy to install in existing vaults. Split-core CTs could also or alternatively be used, for example, if the device is powered from the line current. In one embodiment, a transducer is required for each monitored conductor. The transducers will provide a voltage output suitable for monitoring by the microprocessor and the power quality monitor. The Rogowski-coil transducer outputs are normally integrated, since the raw output is proportional to the derivative of the current, but in some embodiments that may not be desirable (e.g., some embodiments having no power quality monitor). One embodiment includes amplification, rectification, and low pass filtering.

In one embodiment in which a power quality monitor is present, the current transducers are used for secondary conductor current monitoring, and current limiter operation.

In various embodiments, voltage transducers involve direct connections to low voltage (600V and below) secondary conductors. Power resistors are preferably used to reduce the voltage to small signal levels; however, such resistors are not required or can have any suitable purpose.

In various embodiments, voltage transducers are not present or are integrated into optional components, such as a power quality monitor.

In one embodiment, a transmitter beacon enables the utility to find open conductors or any other suitable alarm conditions (e.g., as declared by the microprocessor or other connected equipment, or relayed through a transceiver) relatively easily compared to other signaling methods such as a flashing light (requiring someone to look down the manhole at night), a local display (requiring someone to be in the manhole), or other RF means (requiring an antenna installed near the manhole for RF propagation); however, the transmitter beacon is not required and can provide any suitable functionality with any suitable degree of difficulty.

In one embodiment, the beacon is designed to enable its signal to penetrate rock, water, or any other suitable object so that it can be received above ground and in a vehicle; however, the beacon can have any suitable design and the signal can have any suitable penetration and/or transmission properties. Range is preferably at least 20 feet through solid earth; however, the range can be any suitable distance through any suitable object. In one embodiment, the beacon periodically (e.g. once every few seconds or any other suitable schedule) transmits a burst message consisting at least of the device's identification or any other suitable information. Optionally, the number of open conductors, or other alarm status details, can also or alternatively be transmitted. In one embodiment, beacon operation is similar to avalanche-locating devices which use VLF radio to transmit through snow.

The transmitter beacon preferably transmits a signal through many feet of rock, earth, water, metal, concrete or any other suitable substance; however, the transmitter beacon can transmit a signal any suitable distance in any suitable manner. A transmitter in the VLF range (3 kHz-30 kHz), or even possibly in the ULF range (300 Hz-3 kHz) or LF range (30 kHz-300 kHz) can be used by a system with enough power if desired. In various embodiments, any other suitable schemes such as FSK or MSK schemes used in VLF bands can be used.

The system will preferably use a loop antenna; however, the system can use a ferrite coil antenna or any other suitable device. An earth-conduction antenna is used on another embodiment. In one embodiment, a simple modulation scheme is used to send a short bit sequence, comprising at least a unique ID for the device or any other suitable information; however, any suitable modulation scheme can be used. The number of open conductors or any other suitable alarm status as determined by the microprocessor or any other suitable device may also or alternatively be transmitted. One modulation technique used in one embodiment is to use existing modem schemes (e.g., Bell 103 (300 baud), Bell 212A, V.21, V.22, etc. V.29, half-duplex scheme, FSK or MSK schemes, or any other suitable schemes). Keeping the spectrum below 9 kHz is desirable, since no FCC regulations apply below that frequency; however, the system can utilize any suitable spectrum.

Due to the propagation characteristics of one embodiment, the antenna can be located anywhere in the underground vault (with possible restrictions due to large metal objects in the vault) and line of sight to the receiver is not needed. In various other embodiments using any other suitable RF technique (Bluetooth, etc.) an open path to the receiver desirable, which can complicate the installation by making an antenna near the manhole (or at least with line of sight to holes in the manhole) desirable. In one embodiment, the antenna is shared with the transceiver.

In various embodiments, multiple antennas are used to provide substantially omni-directional transmission. In one embodiment which includes a transceiver, directional antennas are used selectively to optimize VLF network routing.

In one embodiment, the system includes a VLF transmitter with a design similar or identical to the transmitter beacon described in various embodiments above and a receiver with a design similar or identical to the VLF radio described in various embodiments below; however, the system is not required to include the VLF transmitter or the VLF radio and these two devices, if present, can have any suitable design.

In one embodiment, messages are decoded and received by the microprocessor of a device. If the device is not the intended receiving device, the message is rebroadcast by the device so that other nearby receivers can receive it. The protocol used in one embodiment forms a VLF mesh network through out a portion of or the entire underground network grid. A message is passed until the recipient receives it. The protocol can include mechanisms to prevent feedback propagation, such as preventing a device from broadcasting a message it has already broadcast once within a specific time frame, maintaining a virtual map of the network and not broadcasting a message received from another device that is closer to the intended receiving device, or any other suitable mechanism or scheme for preventing a message from propagating between two or more devices in the network repeatedly. In various embodiments, network routing information is sent to the microprocessor to improve routing. Preferably, the nodes are generally substantially permanently installed, but some ad-hoc capability is preferably present to handle varying RF characteristics and the randomness of endpoints such as users with PDA or any other suitable factors; however, the nodes and the network can be configured or reconfigured in any suitable manner.

In various embodiments, two or more VLF loop or ferrite antennas or any other suitable antennas are used in one or more underground locations. For antennas having a directional nature, having two or more antennas enables a diversity reception effect, and also lets the device selectively transmit in certain directions, improving routing if the microprocessor knows which direction is optimal for reaching the destination node or an intermediate node.

In one embodiment, the receiver includes a separate pickup coil or transducer to receive 60 Hz and/or harmonic noise. This signal may be used for 60 Hz synchronization, cancellation algorithms such as comb filtering, "shift and subtract" of one 60 Hz cycle from succeeding cycles (to remove synchronous noise), or any other suitable algorithm to reduce noise in the VLF receiver or for any other suitable purpose, either with analog circuitry or digitally or with any other suitable mechanism. In various embodiments, a separate DSP or other processor performs the receiver decoding function instead of the microprocessor.

In one embodiment, due to low bit rates and/or low SNRs, encoding algorithms and error correction/detection algorithms are desirable along with a protocol to enable high-priority alarms to propagate through the VLF network ahead of low-priority traffic; however, neither such algorithms nor such protocols are required.

In one embodiment, messages are sent between two underground nodes (e.g. from one network protector in a vault to a remote network protector in a distant vault), or from one underground node to an endpoint above ground (e.g. a user with a PDA, or a VLF-WAN bridge). In various embodiments, message routing ends when the destination is reached, unless the message type is a broadcast message; however, message routing can be conducted in any suitable manner. In various embodiments, packets are "unreliable" (e.g. no acknowledgements) or "reliable", and either or both of connectionless or connection-type modes are implemented.

In one embodiment, the network is designed to replace slower, less reliable Hazeltine and other power-line carrier methods; however, it is not necessary for the network to replace such methods and the network can be designed in any suitable manner. Broadband-over-powerline (BPL) can be inefficient for some applications, and installing fiber or Ethernet can be too expensive for some applications. The RF nature of this embodiment makes installation inexpensive, and the propagation characteristics of the ULF/VLF/LF band provides reliability.

In one embodiment in which a VLF receiver and antenna is present in the system, the system also includes a tuned circuit and decoder to receive WWVB time signals at 60 kHz or any other suitable device to receive any suitable signals at any other suitable frequency. Preferably, this enables a device to keep correct time; however, it is not necessary for any device to keep correct time.

Contact voltage (sometimes called stray voltage) is an undesired voltage on an exposed conductor. This is often caused when a manhole cover or metal grating becomes energized due to contact with a live conductor, either directly (due to failed wire insulation), or indirectly through water, snow or any other suitable conducting mechanism. Serious injury or death can occur from contact with these energized metallic objects. Since some or all of the system is installed in various embodiments in an environment where the possibility for contact voltage exists, the system can be installed with a transducer to monitor, record and/or report this condition.

In one embodiment, the transducer measures the voltage between one or more exposed conductive objects (e.g. manhole, manhole ring, metal grating, junction box cover, etc.) and a system neutral. The transducer normally presents a high impedance between the two measurement points (e.g., over 1 mega ohm or any other suitable value) to prevent directly connecting metal objects to neutral (which could cause ground currents to flow if the metal object also has a path to ground). If a voltage develops, the transducer reduces the apparent impedance to more closely mimic the human body impedance, to prevent RF and other non-60 Hz noise from falsely registering. The impedance is dynamically adjusted as the voltage rises, with a minimum of 500 or 1500 ohms being typical; however, the impedance can be adjusted in any suitable manner. The voltage at the lowest impedance (or below some reference impedance) is used to declare a contact voltage alarm in one embodiment; however, any suitable voltage or other value can be used to declare a contact voltage alarm. To prevent ground currents or for any other suitable purpose, the transducer does not keep the impedance low for a long period of time in one embodiment. The transducer periodically lowers the impedance to check the contact voltage. In various embodiments, the transducer can also or alternatively use the change in voltage vs. impedance to estimate the source impedance and use that information to adjust its own impedance changes. The voltage, transducer and/or source impedance are preferably logged for later download; however, logging is not required. In one embodiment, the transducer impedance is fixed at certain value and/or the impedance vs. voltage and/or current curve are selected by the utility or any other suitable entity, depending on local standards or any other suitable standards.

In one embodiment, if a contact voltage alarm is triggered (e.g., using setpoints programmed by the utility with any suitable software or using any other suitable triggering mechanism), the alarm is transmitted with the VLF beacon or sent over any suitable network or communicated and/or transmitted in any other suitable manner such as an audible alarm.

In one embodiment, a low power microprocessor (e.g. a PIC nano Watt processor or any other suitable processor) is used. In various embodiments, power is drawn from the contact voltage itself if the voltage is high enough. For example, if the contact voltage is below 5 volts, then the voltage is not recorded (and is safe according to various embodiments). If the voltage rises above 5V, a device powers up and starts recording the voltage at periodic intervals. As the voltage rises, the unit can draw more power from the contact voltage itself. If the voltage rises above a programmable or fixed threshold, one or more alarm beacons are enabled, depending on available power. For example, a VLF beacon, audible alert and/or any other suitable alert can be enabled. In a self-powered mode, if the voltage returns to a level insufficient to power the unit, the microprocessor goes back to sleep. In one embodiment, as the voltage rises (thus indicating a more dangerous condition), the available power increases, enabling increasingly powerful alarm enunciators.

In one embodiment in which the power supply is drawing power from the contact voltage itself, the power supply is integrated into the voltage transducer circuitry, which is also dynamically adjusting the impedance appearing between the contact point and neutral. Preferably, the varying power consumed by the device does not substantially vary the impedance selected by the microprocessor; however, the varying power consumption can have any suitable effect.

In one embodiment, the utility can survey the system with a portable reader. This reader can be shaped like a metal detector or any other suitable device, with a coil at the end of a pole or any other configuration. The coil induces power magnetically into the receiver coil of a monitoring device. This receiver coil both receives data from the portable reader, and powers up the device in one embodiment. The device continues to receive power until enough energy is stored for the device to transmit back whether an alarm condition has been reached anytime during the recording. This is analogous to RFID self-powered techniques, but at low frequency or with any other suitable modifications or no modifications at all. In various embodiments, the device can be powered and read through metal enclosures such as streetlights, manhole covers, metal junction boxes, switchgear or any other suitable obstacles. In one embodiment, communications range is about 1-2 feet, even through a 1" thick manhole cover; however, the communications range can be any suitable distance. The portable reader can continue to query the device for recorded data (e.g., histograms, stripcharts or other suitable data) recorded when the voltage was high enough to power the unit or at any other suitable moment.

In one embodiment, a plurality of ferrite-core coils are used, in an orthogonal tri-axis configuration or any other suitable configuration, to insure omni-directionality or for any other suitable purpose. In one embodiment the unit is powered from the received RF energy by using the induced, rectified voltage from the coil(s) to charge a capacitor. Once the capacitor is charged with enough energy to transmit a message back, the microcontroller wakes up and sends a status message back to the receiver. In one embodiment, this is accomplished by charging the capacitor through an inductance of opposite reactive to the capacitor. In other embodiments, other switch-capacitor methods are implemented, such as capacitor charge-pump designs using a static CTS or Dickson charge pump or any other suitable charging mechanisms.

In alternate embodiment, the device is powered by a primary battery, with an expected lifetime of at least 5-20 years or any other suitable length. In another alternate embodiment, the device can power itself from energy harvested from ambient RF fields (e.g., AM and FM broadcast bands or other suitable signals). In still another embodiment, a solar cell or any other suitable power source (e.g., wind, hydroelectric, fuel cell, tidal, geothermal, etc.) is used for energy harvesting.

In various embodiments, a utility crew surveys an area periodically (e.g., once year, once a season or any other suitable time period) or after an event likely to produce contact voltage (e.g., after a snow storm, an earthquake, a flood or any other suitable condition). In various embodiments, a user can probe each device by walking by each device location with the portable reader, briefly holding the reader so the loop end is near the device. After a few seconds, the reader can determine if there has been a contact voltage present or not at that point, without removing any covers. At least because the device is present and recording if the voltage is above a programmable level, the utility can detect intermittent contact voltages.

In one embodiment in which an audible alarm is present, members of the public can hear the alert and call the utility. In various other embodiments in which a VLF network is present, the VLF beacon alert can be rebroadcast through the VLF network to a bridge or a user with PDA if present elsewhere in the system.

In various embodiments, one or more other sensors are monitored by the device. In one embodiment, contact or ambient temperature is monitored, to detect steam leaks or excessively hot manhole covers or any other suitable conditions. In one embodiment, substantially continuous monitoring even when self-powered with no contact voltage present is ensured by using a passive temperature sensor, such as a snap-switch thermostat, which opens or closes mechanically at a certain temperature or any other suitable device. In one embodiment in which the device is powered remotely from a reader, the microprocessor can determine the state of the thermostat. In some embodiments, this sensor switch is not resettable by the user. In one such embodiment, the entire device (or at least the thermostat of that device) is replaced following the switch being triggered. The cost of such replacement is frequently small compared to the cost to fix the problem that caused the over-temperature.

In one embodiment, a monitoring device is small enough to mount inside a streetlight, junction box, anywhere metal is exposed to the public or any other suitable location. In one embodiment in which a monitoring device is placed within a manhole, the device is mounted to the side on the ring insert, just below the manhole; however, the device can be mounted in any suitable location. The utility may mark the outside of the enclosure with the location of the device on the inside, so the reader antenna may be optimally positioned during a query; however, such marking is not required.

In one embodiment, the system includes a power quality monitor having any of the features described in U.S. patent application Ser. No. 10/958,685, filed on Oct. 6, 2004, entitled "SYSTEM AND METHOD FOR PROVIDING REMOTE MONITORING OF VOLTAGE POWER TRANSMISSION AND DISTRIBUTION DEVICES", incorporated herein by reference in its entirety or any other suitable features. In another embodiment, the system includes a wireless network having any of the features described in U.S. patent application Ser. No. 10/920,460, filed on Aug. 18, 2004, entitled "SYSTEM AND METHOD FOR PROVIDING REMOTE MONITORING OF VOLTAGE POWER TRANSMISSION AND DISTRIBUTION DEVICES", incorporated herein by reference in its entirety or any other suitable features. In various embodiments, components of the power quality monitor is shared with other components of the overall system (e.g. power supply, voltage and current transducers, microprocessor, RF link or any other suitable components).

In one embodiment, the system includes a mechanism or device which enables the utility or any other suitable entity to detect secondary conductor failures and/or to monitor current and power flow through the network grid. In this embodiment, transducers measure current levels and the information is processed by a microprocessor.

An open limiter in this embodiment substantially prevents any current flow through a failed conductor. Preferably, the transducer correspondingly measures zero in such a situation; however, the transducer can measure any suitable value in any suitable condition. In one embodiment which involves a real system, noise pickup and pickup from adjacent conductors can cause the transducer to read a small, but non-zero value. Such a condition may or may not prevent the microprocessor from declaring an open conductor. However, since the conductors for a phase are wired in parallel or for any other suitable reason, in at least one embodiment, the current through each should be well matched. In one embodiment, the microprocessor can measure the current in each conductor for a given phase. The maximum current or any other suitable value is used as a baseline, and the current through each of the other conductors is compared against that value. If a conductor current is below a certain threshold (e.g. 5% of the max current reading or any other suitable value), then it is declared "open", despite the non-zero measurement. In various embodiments, the utility can set the threshold higher (e.g. 75% or any other suitable value), to detect other conductor problems that would cause a current flow mismatch (e.g., bad cable joints or other suitable conditions) in addition to an open limiter or outright cable failure or for any other suitable reason.

In one embodiment in which some portion of the system includes only one conductor per phase, the above algorithm may or may not be desirable, because the current would have to be compared from one phase to another, and the true phase currents may not be balanced.

In various embodiments, one transducer is used for the voltage measurements. The other voltage phases are assumed to be 120 degrees (or the nominal phase angle) apart from the measured phase, or other suitable relation to the measured phase. If the voltage magnitude is measured, the other voltage phases are assumed to be equal to the measured phase, or other suitable relation to the measured phase, unless other information is available to the contrary.

In one embodiment, the microprocessor employs multiple algorithms in parallel to declare an "open" conductor. In various other embodiments, the microprocessor uses a comparator instead of an A/D converter to determine if the current is below a threshold value.

In various embodiments, the actual line voltage is not measured, but the voltage phase reference is used to compute power flow direction. In such an embodiment, a single electric field sensor is used to get a phase angle reference. Voltage magnitude is not measured with this technique in one embodiment, but a phase reference is determined, which enables the power quality monitor to determine direction of power flow, displacement power factor or any other suitable value. Direction of power flow can be useful information in network grid monitoring.

In various embodiments, one transducer is used for the above measurements. The other voltage phases are assumed to be 120 degrees apart from the measured phase.

In various embodiments, a high speed RF link is installed. This can be a Bluetooth, ZigBee or WiFi link or any other suitable link to user device such as a PDA using software or a laptop using software or any other suitable device.

In various embodiments, the user uses this link to download recorded data logged by the microprocessor. Since the data could be several megabytes, a high-speed (over 28800 bits per second) is desired in various embodiments. An RF link is preferable since that avoids costly entrance into the underground vault; however, any suitable link can be used. Once the user retrieved the data, examined any real-time readings desired, and optionally sent new setpoints to the device, the user would disconnect from the device.

In one embodiment, due to the propagation characteristics of the high rate RF link used, line of sight from the RF transceiver to the user's transceiver is desirable. The RF transceiver (or antenna) is located directly underneath a manhole cover or metal grating. This will allow the RF to propagate through holes in the manhole cover, or gaps in the grating. The user's transceiver is located directly above the device's antenna. Alternatively, the user could lower an antenna or transceiver into the underground vault. For example, a laptop user with a USB Bluetooth adapter could use a long USB cable to dangle the Bluetooth module down into the vault through a hole in the manhole cover (or gap in the metal grating), without removing the manhole cover or grating.

In one embodiment, an RF protocol that supports mesh networking (e.g. ZigBee or any other suitable protocol) is used. In this embodiment, the device may act as a mesh node, passing traffic to other devices within RF range. In various embodiments, the RF link transceiver is a separate module or is integrated with another component such as the power quality monitor. The RF link may be used in a permanent connection mode when used with RF-WAN bridge in various embodiments. With such a connection, it may be that no local user is present.

In various embodiments, a device has one or more digital interfaces to other nearby equipment. The link can be RS-232, USB, RS-458, infrared, or any other suitable short-range local link. The system can also include a digital relay in a network protector. The microprocessor can periodically poll the relay and receive relay alarms. This data can be logged by the microprocessor for later retrieval. Optionally, equipment alarms can be sent through a VLF beacon and/or other suitable communication paths. The microprocessor in one embodiment functions as a bridge between the other equipment and other software through any suitable paths.

In various embodiments, a device has a digital interface to another device of the same type, for example if more than one is installed in the same location. This enables multiple devices to share any suitable communications links, if desired.

The microprocessor of one embodiment is connected to analog sensors and transducers. These may monitor environmental parameters such as temperature, water level, oil level, humidity and/or any other suitable values. Other sensors may be installed in other equipment to allow the microprocessor to monitor equipment parameters. For example, an underground transformer may be monitored for oil pressure, temperature or any other suitable values. The analog values are digitized by A/D circuitry, and logged by the microprocessor. Readings may be viewed in real-time with software and recorded data can be analyzed. These sensors may be logged indirectly by microprocessor if another component (e.g. power quality monitor) actually digitizes the raw signals or under any other suitable conditions.

In one embodiment, the system includes a VLF-WAN bridge that enables the VLF transceiver or VLF beacon to send data through a WAN system such as WiFi WiMax, digital cell phone network, Ethernet or any other suitable network. The data rate can be severely limited by the VLF transceiver. Bridge devices can be installed above ground, near a convenient WAN connection point or at any other suitable location. The propagation of the VLF signal allows data transfer from the underground locations to the above ground bridge. Many underground devices can share the same bridge in various embodiments. Collision algorithms (e.g. CSMA/CA) may be desirable for such sharing. When used in conjunction with VLF message passing from vault to vault, the bridge functions for the entire VLF mesh network in one embodiment. Installing more bridges in strategic locations can increase the net throughput of the VLF-WAN link, since more VLF transceivers will be able to operate in parallel (instead of requiring VLF message passing).

In one embodiment, the system includes a high-speed RF-WAN bridge that links the high-speed RF transceiver and a WAN (typically Ethernet, WiMax, digital cell phone network, or any other suitable network). Due to the limited propagation in various embodiments, it may be difficult for multiple devices to share the same bridge, although it can be allowed where conditions permit. One embodiment includes a building-mounted bridge with a directional antenna pointed down. If the antenna is high enough, multiple underground vaults may be reached.

In various embodiments, the bridge allows remote high-speed communication to the microprocessor using PC software. A local user is not required and automated status checks and data downloads with PC software are possible. A remote user may also manually initiate a data download, or view real-time readings and waveforms, when available.

In one embodiment in which the VLF transceiver is installed, the bridge may also be used to pass information from other underground locations to the location connected to the bridge. This lets other underground systems share the bridge, albeit at the data rate of the VLF transceiver. This can make it desirable to limit data to alarms or status conditions.

In one embodiment, a bridge responds to alarms and polls devices for status conditions. The bridge may take action based on a received alert by sending a message through the WAN (e.g., emailing an end user, or sending a message to PC software or any other suitable action).

In various embodiments, PC software is used to communicate with devices, either through a local connection via or remotely with a bridge. A VLF transceiver connected to a PC is also possible in various embodiments. The PC software lets the user view real-time readings and waveforms (when available), send and retrieve setpoints and recording parameters, download data, set the device clock, and upgrade device firmware or perform any other suitable tasks.

In various embodiments, the PC software provides data graph and report generation, data management and storage, and data analysis functions. The communications portion of the software may be implemented as a separate software system (e.g. a separate Windows NT service), and does not necessarily have to run on the same PC as the data viewing portion.

The PC software can include a scheduler that can initiate all communication actions with remote devices on a scheduled basis, for automated data downloads or any other suitable action. The software also responds to received device alarms, and can relay alarms via email or other network means to end users or other systems in various embodiments.

In various embodiments, the PC software may reside on the user PC or may be delivered with a web service application hosted by a third party or can reside in any other suitable location.

In various embodiments, PDA software provides some or all applicable functionality of the above described PC software, but on a PDA, typically a Palm or Pocket PC-based PDA or Smartphone, BlackBerry or any other suitable device. One embodiment includes all communications functions, real-time reading and waveform viewing, and data download and device initialization.

The PDA may be connected to the device with a portable VLF receiver, or with Bluetooth, ZigBee or other high-rate RF link or any other suitable communications device. In one embodiment, a user with the PDA must be physically close to the underground location; however, in other embodiments such proximity is not required.

In one embodiment, the VLF receiver is used by the utility to find open conductors or other alarm conditions. The utility could survey the entire network grid on a periodic basis (e.g. once a month, once a year, etc.) Due to the propagation of the transmitted RF, the signal can be received while the utility worker and receiver are in a vehicle, near the underground location. The utility worker does not need to enter the underground vault, remove a manhole cover, or even stop to look into the manhole. This enables the utility to quickly survey the network grid without disrupting traffic or causing other problems.

In this embodiment, the radio receiver antenna could be a loop or ferrite-coil. One embodiment utilizes a radio front-end connected to a PDA or hand-held computer. Techniques to reduce noise pickup can be used to reduce 60 Hz and harmonic noise caused by the secondary grid conductors or any other noise.

If a beacon is detected, the utility can decide whether to investigate further by going into the manhole. If the alarm is for an open conductor, the utility may choose to repair the conductor, or leave the conductor open, and program the device to stop transmitting the beacon for that open conductor. If a new conductor becomes open later, the device will again start transmitting. The utility can process other alarm conditions similarly.

The VLF alarm receiver functionality may be provided in one embodiment without a PDA, if no other functions are needed.

The radio receiver will log all received beacons in one embodiment, and this logged data can be collected and stored in a PC database, and accessed with customized PC software for later analysis.

In an embodiment in which a bridge is present, the PDA may connect to the same WAN by some other means, and thus connect to a remote device. For example, if the bridge connects the underground device to the Internet, a PDA with software may connect to the Internet by some other means (e.g. cell phone network), and through that connection communicate to the underground device.

A typical use for PDA software in one embodiment is for a utility worker to visit a site, and download recorded data, and check for alarms. If an alarm is detected, the utility may decide to enter the underground location and investigate. If no alarm is detected, the user may download any recorded data (without having to remove a manhole cover or grating, or enter a vault), and continue to the next site. When back in the office, the PDA user can synchronize any downloaded data, alarm logs, connection logs, etc. to PC software system.

PDA software can act as an ad-hoc bridge in one embodiment. If a user connects the PDA to an underground device using a link, and the PDA also has a separate connection to a WAN (e.g. through WiFi, or a cell phone link), the PDA software can provide the same functionality as a bridge.

In various embodiments, the PDA software may reside on the user PDA, or may be delivered with a web service application hosted by a third party or can reside in any other suitable location.

In one embodiment, a PLC link is installed. The link can use an INSTEON, HomePlug, DS-2, Yitran, CE-Bus, or other suitable powerline communication protocol. This link enables the device to join a PLC network and send messages to a remove PC or any other suitable device. Message passing is also possible using PLC protocols which support mesh networking or routing functions. A remote PLC-LAN/WAN bridge may be used in one embodiment to connect the device to a central PC or monitoring station. Alarms may be propagated through the PLC network to a remote station. In another embodiment, data may be downloaded through the PLC network, if network bandwidth is sufficiently high for the desired rate of download. Multiple PLC protocols may be utilized for different tasks. For example, a low bit-rate, high reliability protocol such as INSTEON may be used for alarm, alert, and status conditions, while a high-rate protocol such as HomePlug AV used for data download.

The PLC link may be implemented with a separate PLC module, or the processing may be performed by the device microcontroller or power quality monitor or any other suitable device in various embodiments. The analog front end may also be partially or fully shared with power quality monitor or any other suitable measurement subsystem.

It should be appreciated that monitoring can include any suitable combination of status monitoring, measuring and/or recording of any suitable value, condition data or value. It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An underground monitoring system comprising:
   one or more sensors configured to monitor an underground electrical system; and
   a processor configured to monitor the one or more sensors, and
   an alarm device configured to send an alarm if the processor determines that the one or more sensors detects a predetermined condition of the underground electrical system.

2. The underground monitoring system of claim 1, wherein the condition is a cable fault.

3. The underground monitoring system of claim 1, wherein the alarm device is a beacon.

4. The underground monitoring system of claim 3, wherein the beacon is a VLF beacon.

5. The underground monitoring system of claim 1, wherein the alarm device sends the alarm via a power line communications link.

6. The underground monitoring system of claim 1, wherein the alarm device sends the alarm via a WAN link.

7. The underground monitoring system of claim 1, wherein the alarm device sends the alarm via an RF communications link.

8. The underground monitoring system of claim 1, further comprising:
   a receiving unit configured to receive an alarm; and
   a sending unit configured to relay the alarm.

9. The underground monitoring system of claim 1, wherein at least one of the one or more sensors senses an environmental condition.

10. The underground monitoring system of claim 1, wherein at least one of the one or more sensors configured to monitor is further configured to monitor status, measure or record.

11. The underground monitoring system of claim 1, wherein the alarm device is configured to send the alarm audibly or visibly.

12. A method of monitoring an underground electrical system comprising the steps of:
   monitoring an underground electrical system with one or more sensors;
   causing a processor to monitor the one or more sensors, and
   sending an alarm with an alarm device if the processor determines that the one or more sensors detects a predetermined condition of the underground electrical system.

13. The method of claim 12, wherein the condition is a cable fault.

14. The method of claim 12, wherein the alarm device is a beacon.

15. The method of claim 14, wherein the beacon is a VLF beacon.

16. The method of claim 12, wherein the alarm device sends the alarm via a power line communications link.

17. The method of claim 12, wherein the alarm device sends the alarm via a WAN link.

18. The method of claim 12, wherein the alarm device sends the alarm via an RF communications link.

19. The method of claim 12, further comprising the steps of:
   providing a receiving unit configured to receive an alarm; and
   providing a sending unit configured to relay the alarm.

20. The method of claim 12, wherein at least one of the one or more sensors senses an environmental condition.

21. The method of claim 12, wherein the alarm device is configured to send the alarm audibly or visibly.

22. The method of claim 12, wherein at least one of the one or more sensors configured to monitor is further configured to monitor status, measure or record.

* * * * *